(12) United States Patent
Sharifi

(10) Patent No.: US 6,298,037 B1
(45) Date of Patent: Oct. 2, 2001

(54) NETWORK DATA FILTERING

(75) Inventor: Kamran Sharifi, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/211,533

(22) Filed: Dec. 14, 1998

(51) Int. Cl.[7] .................................................. G01R 31/08
(52) U.S. Cl. ......................... 370/210; 370/243; 370/246
(58) Field of Search ................................... 370/352, 353, 370/355, 356, 358, 204, 463, 464, 465, 480, 488, 522, 210, 243, 246, 274

(56) References Cited

U.S. PATENT DOCUMENTS

| | | | | |
|---|---|---|---|---|
| 5,832,057 | * | 11/1998 | Furman | 379/7 |
| 5,848,150 | * | 12/1998 | Bingel | 379/399 |
| 6,136,388 | * | 10/2000 | Raoux et al. | 427/569 |

* cited by examiner

*Primary Examiner*—Wellington Chin
*Assistant Examiner*—Brenda Pham
(74) *Attorney, Agent, or Firm*—Samuels, Gauthier & Stevens, LLP

(57) ABSTRACT

An electronic filter has an input connector adapted for electrical connection to a complimentary output connector of an asymmetrical digital subscriber line. The input connector has an input voltage node for providing electrical input signals to the electronic filter. Similarly, the filter has an output connector adapted for electrical connection to a complimentary input connector of a data receiving device. The output connector has an output voltage node for providing electrical output signals from the electronic filter. The filter selectively passes frequency components of the electrical signals, frequency components below a predetermined corner frequency passing from the input connector to the output connector, frequency components above the predetermined corner frequency not passing from the input connector to the output connector.

23 Claims, 6 Drawing Sheets

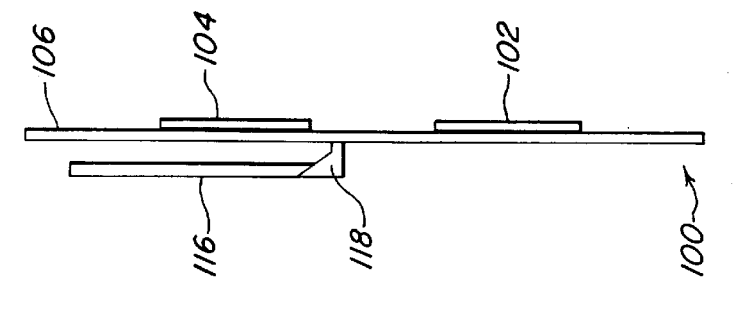
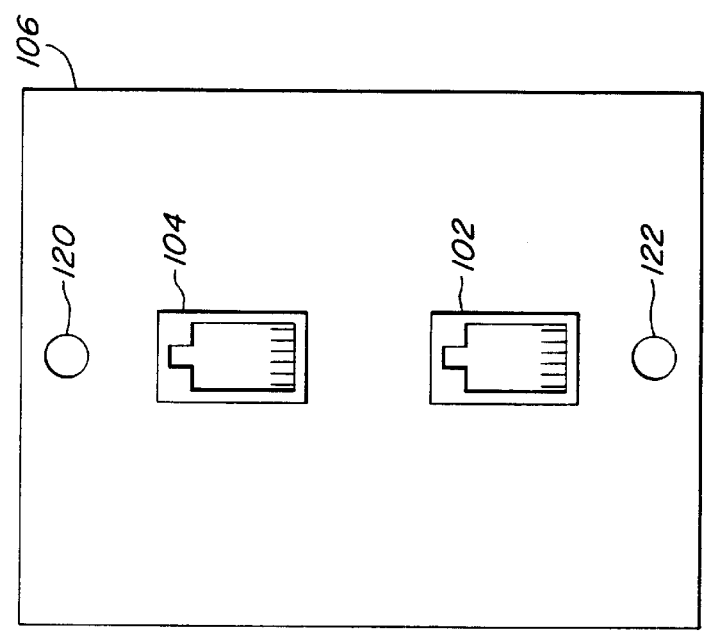
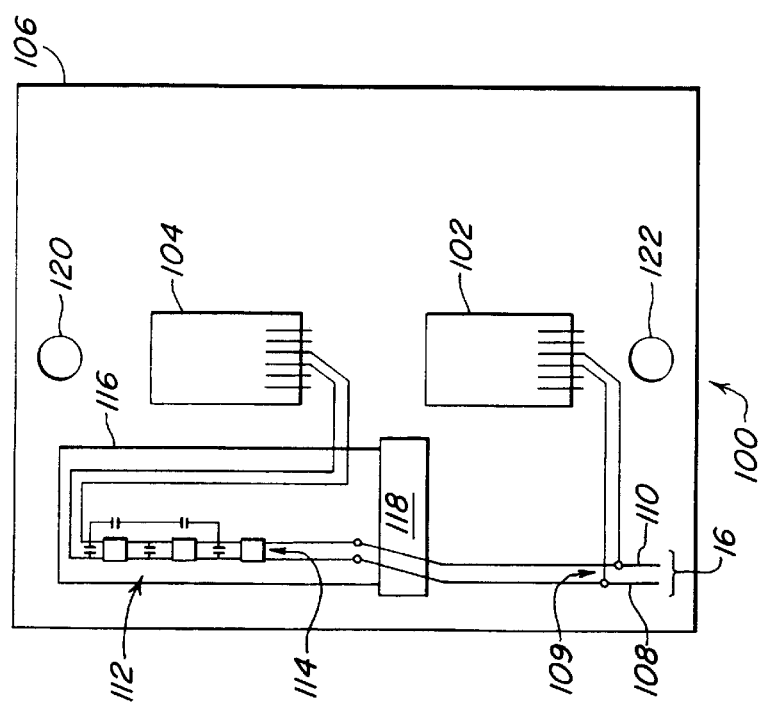

NETWORK DATA FILTERING

BACKGROUND OF THE INVENTION

The invention relates to networks using existing telephone wiring, and, in particular, to filtering high frequency components from electrical signals transmitted along the network and passing low frequency components of the electrical signals to devices using POTS technology (Plain Old Telephone System).

For example, asymmetric digital subscriber line (ADSL) networks transmit electrical signals representing information along existing telephone wiring. The information is, for example, both high frequency digital signals, such as video from a service provider transmitting a pay-per-view movie to a customer or Internet data, and low frequency analog voice signals, such as the voices of a telephone call carried along the lines of the service provider. Both types of information, high frequency signals and low frequency signals, are combined as components of a single electrical signal.

ADSL networks transmit high frequency digital data asymmetrically. ADSL networks transmit data upstream from a subscriber node (e.g., a home or an office) to a provider node (e.g., a telephone company or an Internet service provider) at a slower rate than the networks transmit data downstream to the subscriber node. In addition, ADSL networks transmit analog voice signals at an even lower frequency than either the upstream or downstream data. In addition, both the upstream and downstream frequency ranges can contain several sub-bands or sub-channels that allow several sets of data to be transmitted in the same direction at the same time by using different frequencies within the respective ranges.

When electrical signals arrive at the subscriber node, the high and low frequency signal components are separated into separate electrical signals for use by an appropriate device such as a television, a personal computer, or a telephone set. To separate the signal into the various frequency components, hardware is installed at the subscriber node. For example, home wiring is broken and a POTS splitter is connected to the home wiring between the break. The POTS splitter separates the low frequency electrical signal components from the electrical signal and sends the low frequency component to the low frequency devices, such as a telephone set, along one wiring path while sending the high frequency component along another path. The POTS splitter sends the high frequency signal component to an ADSL modem and the low frequency signal component to the low frequency devices.

Current methods of adapting subscriber nodes, such as homes, to ADSL technology require changing existing hardware, e.g., inserting the POTS splitter requires changing the existing home wiring and providing additional wiring for the high frequency signal. However, one of the primary advantages of ADSL technology is that it utilizes the existing twisted pair wiring that already exists in most homes. Thus, methods of adapting subscriber nodes to ADSL technology, which require alterations to existing wiring at the subscriber node, reduce the advantages of providing services over an ADSL network.

As another example, future home phone network applications (home PNA) may also use existing telephone wiring within a home to create a local area network (LAN) within the home. While an ADSL network transmits high frequency components on the order of approximately 20 kHz to 1 MHz, residential LANs could transmit even high frequency components on the order of approximately 4 MHz to 10 MHz. As with ADSL technology, methods of adapting existing wiring for use in a residential LANs that require extensive modifications would decrease the advantages of utilizing existing wiring.

SUMMARY OF THE INVENTION

One aspect of the invention is an electronic filter which can be used in conjunction with the existing twisted pair wiring that exists in most homes without requiring modifications to the wiring. The electronic filter receives electrical signals that are transmitted along an asymmetric digital subscriber line of a network. The filter passes low frequency components of the electronic signals to a data receiving device utilizing POTS technology, such as a telephone set.

The electronic filter contains electronic components arranged along a signal processing path. The filter also includes input and output connectors that have corresponding input and output voltage nodes. The voltage node of the input connector provides electrical inputs to the electronic filter, and input connector is electrically connectable to the asymmetric digital subscriber line. The output connector provides electrical outputs from the electronic filter to the data receiving device when the output connector is in electrical communication with the device.

The electronic filter is adapted to selectively pass frequency components of the electrical signals. The filter passes frequency components below a predetermined corner frequency from the input connector to the output connector; the filter does not pass frequency components above the predetermined corner frequency from the input to the output connector.

Preferred embodiments of this aspect of the invention include one or more of the following features.

The input and output connectors can be RJ-11 or RJ-45 connectors and additionally can be jacks or plugs. The connector is modularly formed as a stand alone unit or can be formed as part of an outlet containing a jack connected as a fixture in at a subscriber node. The filter can have an input impedance that matches the output impedance of the local loop and can, for example, be a passive elliptic filter. The filter can be designed with a corner frequency of eight kilohertz.

Each embodiment within the scope of the claims may have one or more of the following advantages. The electronic filter allows existing wiring at a subscriber node, such as a home, to be utilized without requiring modifications to the existing wiring. When installed, the electronic filter filters low frequency electrical signal components from electronic signals, and, thus, eliminates the adverse effects that the high frequency electrical signal components have on data receiving devices, such as telephone sets, for example, signal noise.

The electronic filter is easily installed between the ADSL network and a data receiving device. The electronic filter incorporates the structure of existing jacks and plugs, such as an RJ-11 connector or an RJ-45 connector which, for example, are normally used in homes and offices for voice and data connectivity respectively. Passive embodiments of the electronic filter do not require an additional power source. The electronic filter can be a stand-alone device or can be formed integrally with a jack that can be installed as a replacement outlet in the wall, or other location of the home. Stand-alone embodiments of the electronic filter can be easily installed, removed, and moved to other locations.

BRIEF DESCRIPTION OF THE DRAWING

FIGS. 5a–5c are rear, front, and side schematic views respectively of another embodiment of the electronic filter of FIG. 4 adapted as an electrical outlet wherein the electronic components of the filter are integrally formed with an RJ-11 jack;

DESCRIPTION OF THE PREFERRED EMBODIMENTS

Figure 1:
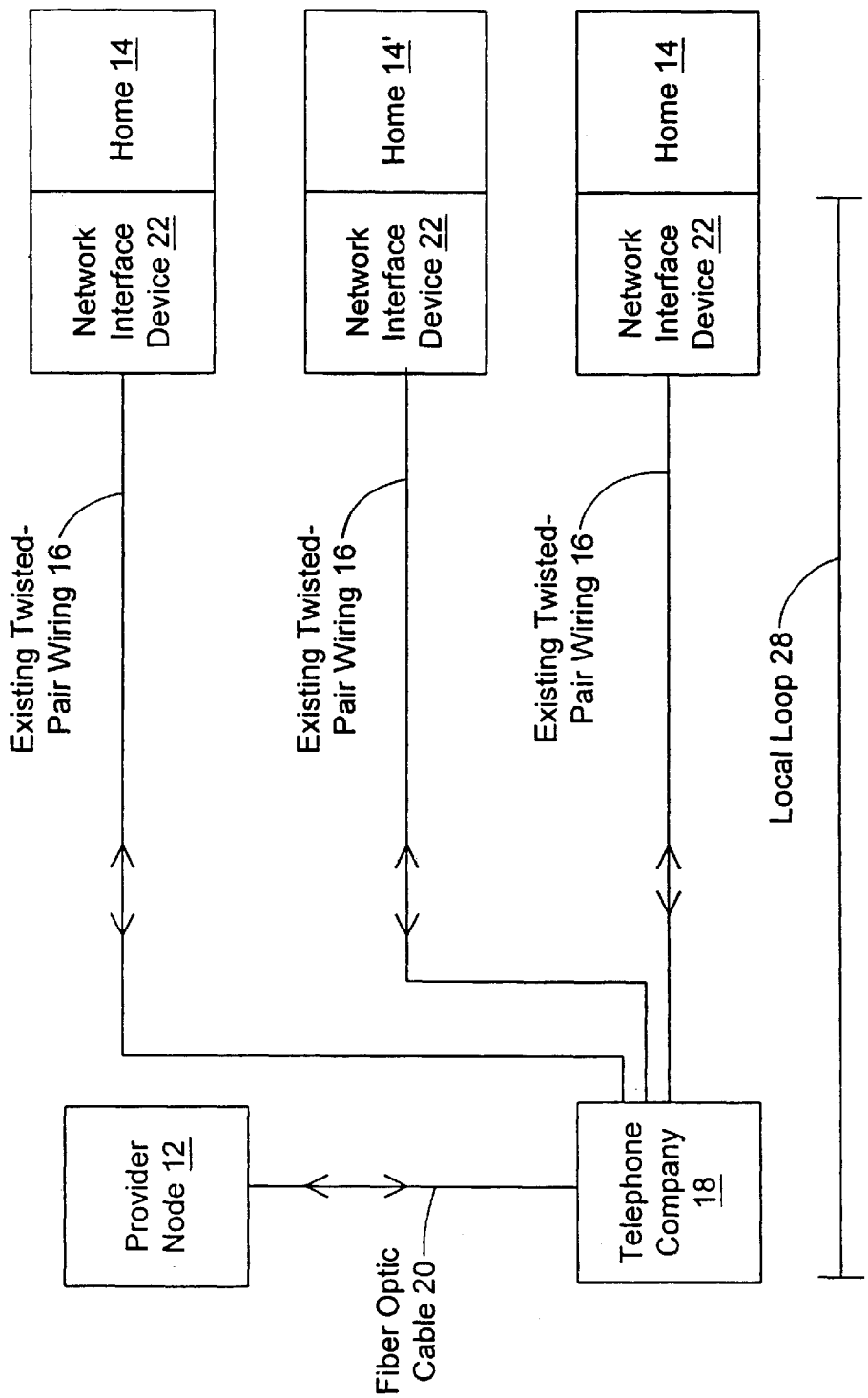
FIG. 1 is a schematic view of a data network configured to employ ADSL technology.

Referring to FIG. 1, a data network 10 is suitable for transmitting digital and analog electrical signals between a telephone company central office 18 and homes 14, 14'. For example, telephone company 18 transmits voice signals, Internet data, and video signals to homes 14, 14' along existing copper twisted-pair wiring 16, and homes 14, 14' transmit voice signals, Internet data and other data (e.g., cable television menu selections to the telephone company to order pay-per-view movies) to the telephone company along the same wiring 16. The signals are transmitted from a provider node 12, e.g., an Internet service provider, to the telephone company central office 18 along a fiber optic cable 20 and, subsequently, to homes 14, 14'.

The transmitted electrical signals travel along a signal path from telephone company 18 to homes 14, 14' along existing twisted-pair copper wiring 16 and through a corresponding network interface device 22. The signal path to each home formed by telephone company 18, existing wiring 16 and network interface device 22 is a local loop 28. Each network interface device 22 is a demarcation node that isolates a home 14, 14' from the corresponding local loop 28. One interface device 22 is attached to each home 14, 14'.

The transmitted electrical signals have both high frequency components, such as digital video signals transmitted at a typical rate of 1.536 Megabits/second (Mbps), and low frequency components, such as analog voice signals that occupy a range of frequencies from 0 kHz to 4 kHz. The various frequency components of the electrical signals provide different data channels that can be utilized simultaneously. For example, using network 10, a subscriber could use the lower frequency 0 kHz–4 kHz voice channel to transmit and receive the analog signals of a telephone conversation while receiving the digital video signals of a pay-per-view movie along the higher frequency channel which resides on a frequency band that is greater than 4 kHz.

However, the telephone lines may be insufficient to transmit high frequency electrical signal components over long distances because the lines have inherent resistances and capacitances that cause excessive losses in the electrical signals and echoes in the lines which degrade the quality of the signal at higher frequencies. Therefore, a network having a relatively longer local loop will have a lower data rate and a network having a relatively shorter local loop can have a higher data rate.

Existing twisted-pair wiring 16 allows ADSL technology to be employed at homes 14. In addition, when configured for ADSL technology, digital signals can be transmitted bidirectionally at asymmetrical rates. For example, a pay-per-view movie can be transmitted to the home at a rate of 1.536 Mbps and a information requesting the movie can be sent to the provider along an additional channel at a rate of 16 kilobits/second (Kbps).

Figure 2:
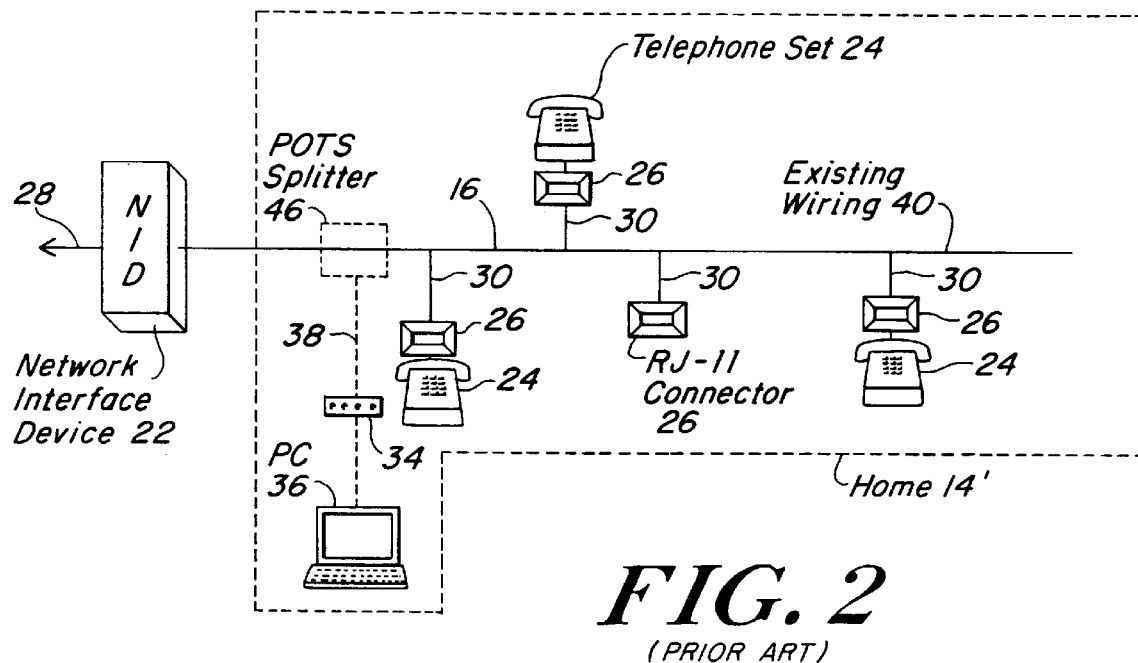
FIG. 2 is a schematic view of a local loop of the data network of FIG. 1 according to the prior art before a home is configured to use ADSL technology, wherein the home includes telephone sets attached to existing POTS wiring through a corresponding RJ-11 jack.

Referring to FIG. 2, within home 14', existing wiring 40, which is similar to the existing twisted-pair copper wiring 16 that forms local loop 28, branches into a set of connecting lines 30. Each connecting line 30 terminates at a connector, typically an RJ-11 jack 26. Home 14' includes three telephone sets 24 that are connected by RJ-11 jacks 26 directly to existing wiring 40 through the connecting lines 30. In addition, an unused RJ-11 jack is present.

Home 14' is not configured for ADSL technology. Home 14' can not simultaneously utilize both high and low frequency signal components because the high frequency components of the electrical signal may interfere with, for example, the telephone voice signals. Telephone sets 24 are electrical devices that receive and utilize low frequency electrical signal components. However, because the three RJ-11 jacks 26 electrically connect telephone sets 24 to existing wiring 40 directly, the telephone sets will receive both the high and low frequency components of the electrical signals, and the high frequency components will interfere with the telephone sets by, e.g., causing electrical noise.

To eliminate the electrical noise and configure home 14' for ADSL technology, a POTS splitter 46 is required as shown in phantom. As described in the background section, the existing twisted-pair wiring of home 14' must be broken to provide a second signal path for the electrical signals. POTS splitter 46 is connected to existing wiring 40 within the break. Additional wiring 38 extends from POTS splitter 46 to an ADSL terminal unit remote (ATU-R) 34, which is a modem that relays high frequency data to a PC 36. The addition wiring 38 provides a conduction path for high frequency data. Existing wiring 40 provides a separate conduction path for the low frequency data. POTS splitter 46 processes the electrical signals received from network interface device 22 to separate the high frequency components from the low frequency components. However, such an alternative placement could require unnecessary effort, cost, complexity. For example, such a configuration may require personnel and equipment from the telephone company for installation.

Figure 3:
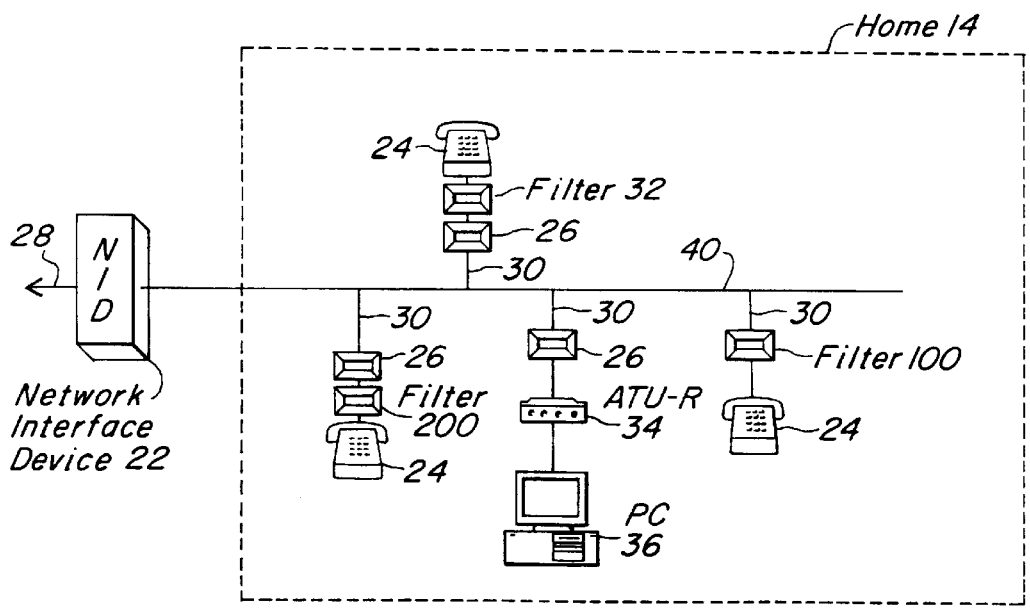
FIG. 3 is a schematic view of a data network according to the invention adapted for use with ADSL technology and having an electronic filter electrically connected between the telephone set and the ADSL network.

Referring to FIG. 3, rather than utilizing ATU-R 34 as shown in FIG. 2, home 14 includes modular filters 32 to eliminate the electrical noise and utilize ADSL technology. Each filter 32 extends between existing wiring 40 and a corresponding one of the telephone sets 24. Filter 32 is a low-pass filter that has a corner frequency of approximately 8 kilohertz (kHz). Therefore, filter 32 passes frequency components of the electrical signals below 8 kHz to telephone sets 24 but prevents frequency components of the electrical signals above 8 kHz from passing to the telephone sets. Alternatively, filter 32 could extend between existing wiring 40 and any other type of low frequency data reception device that receives and utilizes low frequency components of the electrical signals that are transmitted along existing wiring 40.

Thus, when installed, filter 32 can reduce or eliminate the electronic noise due to the presence of the high frequency components. However, hardware, which requires modifications to the existing wiring 40, is not required because filter 32 is installed at the terminal end of connecting lines 30 by connecting to one of the existing standardized RJ-11 jacks 26. Thus, all channels of information transmitted along the local loop can be utilized. High frequency data receiving devices can operate at the terminal end of one of the connecting lines 30 without a low-pass filter. Low frequency data receiving devices, such as telephone sets 24, can operate without interference from high frequency components of the signal by electrically communicating with existing wiring 40 through one of the filters 32.

For example, ATU-R 34 can be attached directly to one of the connecting lines 30 by one of the RJ-11 jacks 26 (or, alternatively, an RJ-45 jack). In such a configuration, ATU-R 34 processes the electrical signal received from telephone company 12 to provide the data present in the high frequency signal components to, e.g., personal computer 36 or a television. ATU-R 34 typically contains a high-pass filter to filter all low frequency signals from the signal and to pass only high frequency signals to high frequency devices. In addition, ATU-R 34 processes signals transmitted from the high frequency devices into high frequency components of the electrical signals and transmits the signals to the provider node 12.

However, in such a configuration, telephone sets 24, or other low frequency data receiving devices, remain relatively unaffected by the presence of the high frequency signal components along existing wiring 40 and are able to utilize signals transmitted along the lower 0 kHz–4 kHz data channel without substantial interference.

Figure 4:
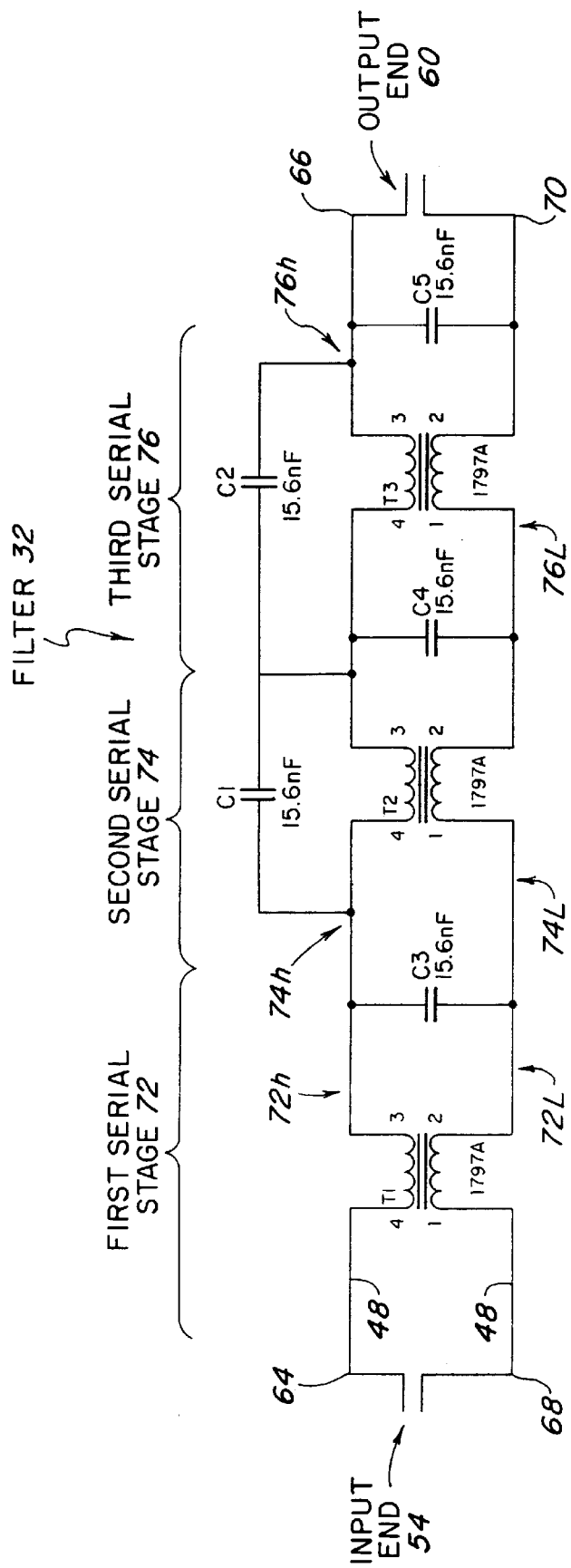
FIG. 4 is a schematic view of a filter of FIG. 3 wherein electronic components of the filter are arranged along a signal processing path between the subscriber line and an RJ-11 jack.

Referring to FIG. 4, filter 32 includes electronic components arranged along a signal path 48. Input end 54 and output end 60 of signal path 48 each have two voltage nodes: corresponding high voltage nodes 64, 66 and corresponding low voltage nodes 68, 70. Each of the high voltage nodes 64, 66 includes a wire that is electrically connected to pin 3 of a corresponding RJ-11 plug, e.g., input connector 42 and output connector 44 respectively (shown in FIG. 4). Similarly, each of the low voltage nodes 68, 70 includes a wire that is electrically connected to pin 4 of the corresponding input connector 42 and output connector 44.

Filter 32 is designed to provide a passive elliptic-type low-pass filter with a corner frequency of approximately 8 kHz. The electrical components are grouped into three serial stages 72, 74, 76, each having a corresponding high voltage side 72h, 74h, 76h and a corresponding low voltage side 72l, 74l, 76l. Each of the three stages, 72, 74, 76 includes a corresponding inductive transformer T1, T2, T3 (e.g., P/N 1797a) electrically connected as illustrated between the high and low side of the stage. Each stage 72, 74, 76 also includes a corresponding 15.6 ηF capacitor C3, C4, C5 electrically connected between the corresponding high and low sides 72h/72l, 74h/74l, and 76h/76l of each stage. In addition, each of the later two stages 74, 76 includes one 15.6 ηF capacitor C1, C2 electrically connected across the corresponding inductor t2, t3 at the high side 74h, 76h of each stage.

As an example, a filter, such as filter 32, can be designed according to the typical specifications in the following table.

TABLE 1

Typical Design Specifications

| Impedance: | 600 Ω @ 0.3 kHz to 3.5 kHz |
|---|---|
| Insertion Loss: | −0.5 db @ 1.0 kHz |
| | −3.0 db @ 8.0 kHz |
| | −6.0 db @ 8.5 kHz |
| | −16.0 db @ 16.0 khz |
| Resistance Isolation to Earth: | 5 MΩ |

Note: Within the specified frequency range, 600 Ω is the presumed impedance for each local loop in North American communications systems. The specification may change for other communication systems.

Embodiments according to the invention can utilize the structure of electronic filter 32 in several different types of devices.

For example, referring to FIGS. 5a–5c, a modular filter 100 is a filtering device that is integrally formed with two RJ-11 jacks 102, 104 to form an outlet 106. Outlet 106 can be installed as a hardware fixture at a home 14 to replace existing outlets. The lower RJ-11 jack 102 provides an unfiltered signal, such as would be used by ATU-R 34 (FIG. 3). Jack 102 electrically connects to twisted-pair wires 108, 110 of existing wiring 40. The upper RJ-11 jack 104 provides a filtered signal, such as would be used by telephone set 24 (FIG. 3), and is in electrical communication with wires 108, 110. Filter 100 is connected between jack 104 and wires 108, 110. Filter 100 includes an input connector 109 that electrically connects the filter to wires 108, 110 without the use of an adaptor such as an RJ-11 connector. In essence, input connector 109 is the end of two metal wires that form electrical contacts.

Filter 100 includes electrical components 112 arranged along a signal path 114; each of electrical components 112 and signal path 114 have the same structure as corresponding electrical components and filter path 48 of filter 32. However, to provide a compact structure that, for example, will fit into the space occupied by an existing switch-plate in a wall, electrical components 112 and signal path 114 are arranged on a circuit board 116 that closely parallels switch-plate 106. A mount 118 secures the base of circuit board 116 to switch-plate 106 on the side of the switch plate that faces a wall. Alternatively, circuit board 116 could be glued in an appropriate fashion to switch-plate 106. Two holes 120, 122 accommodate screws that secure switch-plate 106 to a wall.

Figure 6:
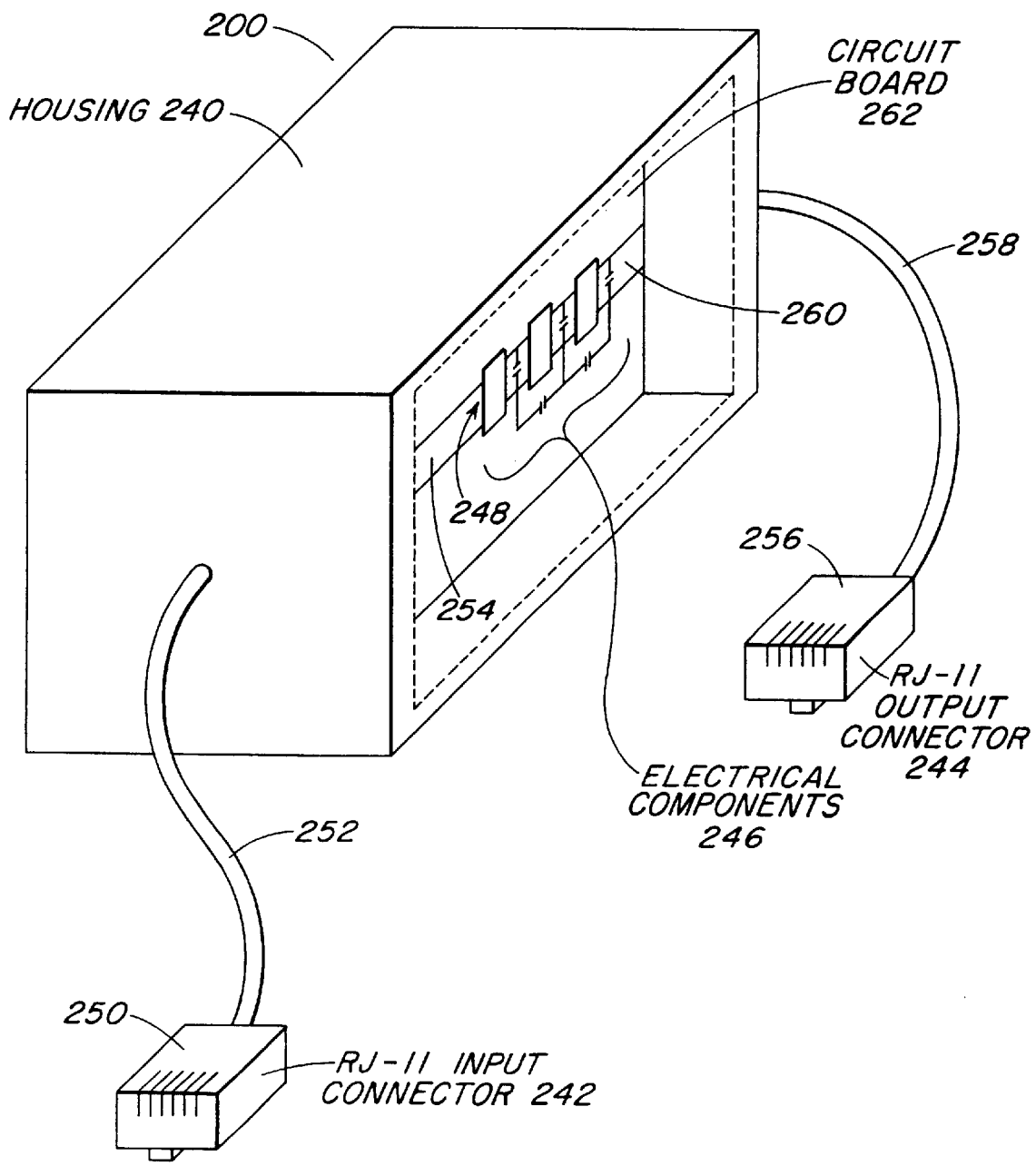
FIG. 6 is a perspective view of still another embodiment of the electronic filter of FIG. 4 adapted as a stand-alone device for connection between the telephone set and the RJ-11 jack, wherein internal electrical components are illustrated through a transparent section of a housing of the filter.

Referring to FIG. 6, filter 200 is a stand alone modular unit having a housing 240, an input connector 242, an output connector 244, and electronic components 246 arranged along a signal processing path 248 on a circuit board 262 within housing 240 to filter high frequency components of the electrical signals. Electrical components 246 have the same structure as the electrical components of filter 32. Input connecter 242 is a standard RJ-11 plug 250 with a wire section 252 that extends through housing 240 and connects to an input end 254 of signal processing path 248. Similarly, output connector 244 is also a standard RJ-11 plug 256 with a wire section 258 that extends through housing and connects to an output end 260 of signal processing path 248.

However, referring also to FIG. 3, filter 200 can be installed at home 14 by an individual who lives in the home rather than by a skilled technician. The individual disconnects one of telephone sets 24, plugs the input connector 242 of the filter 200 into the appropriate RJ-11 jack 26, and plugs the output connector 244 of the filter 200 into the previously disconnected telephone set 24. Alternatively, one or both of the corresponding input and output connectors 242, 244 of filter 32 can include a jack rather than a plug to allow the individual to select the appropriate length of wire to extend from the filter. In such a case, the individual selects a length of wire having standard RJ-11 plugs at both ends of the wire and plugs each of the ends into the appropriate jack of the filter as well as the corresponding jack connected to either existing wiring 40 or a low frequency device, such as telephone set 24.

Other embodiments are within the scope of the following claims.

Figure 7:
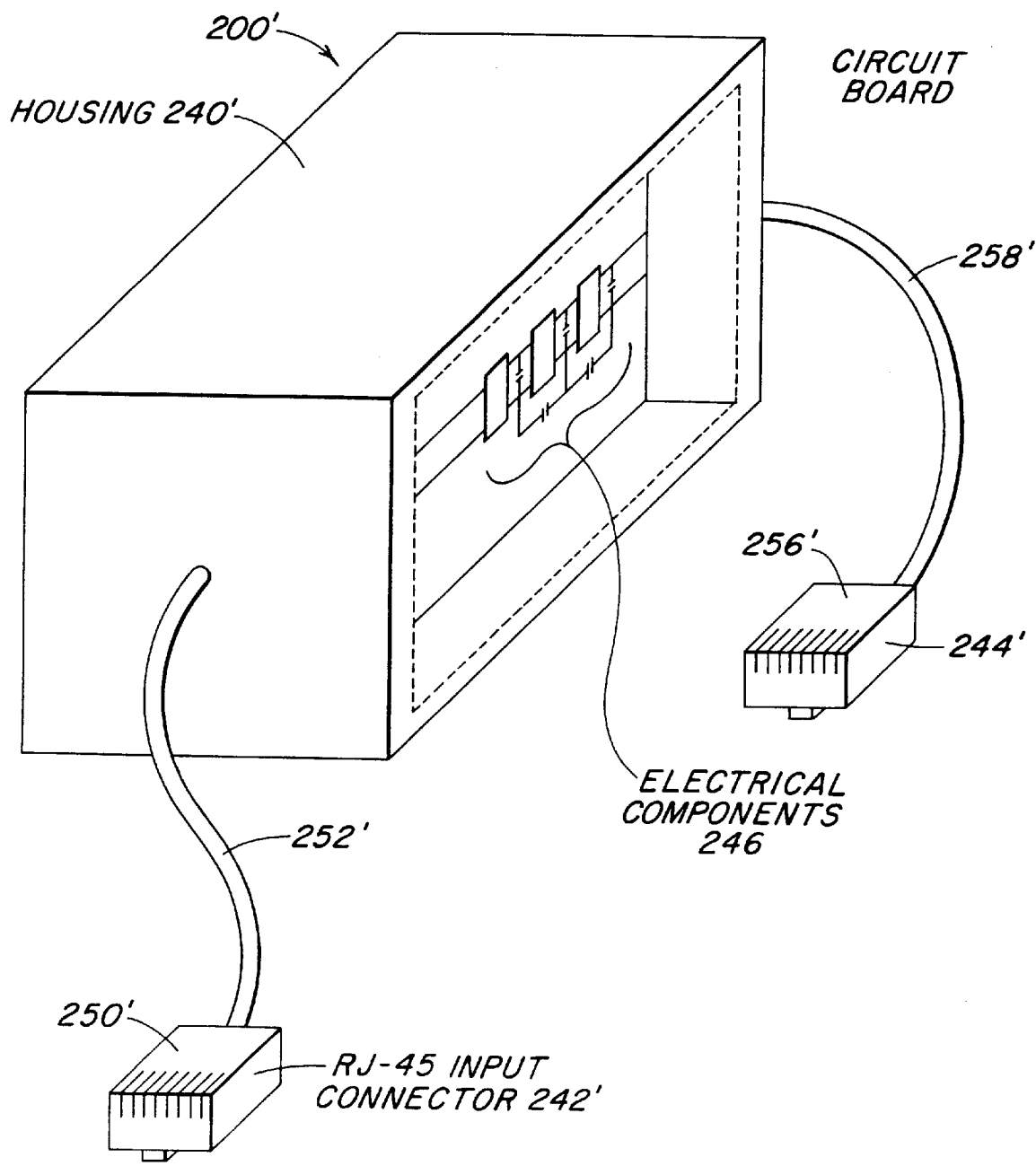
FIG. 7 is a perspective view of an alternate embodiment of the electronic filter of FIG. 6 for connection between the telephone set and an RJ-45 jack, wherein internal electrical components are illustrated through a transparent section of a housing of the filter.

Referring to FIG. 7, filter 200' is similar to filter 200, but both an input connector 242' and an output connector 244' of filter 200' each include an RJ-45 plug 250', 256', rather than an RJ-11 plug 250, 256. Wire sections 252', 258' are lengths of standard electrical wire that are compatible with RJ-45 connectors. Typically, an RJ-45 connector would be used to connect high frequency devices such as PC 36 (shown in FIG. 3).

However, FIGS. 5, 6 and 7 illustrates that embodiments within the scope of the claims can include a variety of connection mechanisms. For example, filter 32 connects to both an RJ-45 connector and an RJ-11 connector in a similar manner. Each of the two high voltage nodes 64, 66 is connected to, e.g., a pin 4 of the corresponding RJ-45 input and output connectors. Each of the two low voltage nodes 68, 70 is connected to, e.g., a pin 5 of the corresponding RJ-45 input and output connectors.

Communication systems using RJ-45 connectors can have varying connections defined. Thus, alternative pin connections can be made. Similarly, alternative connections are theoretically possible for a system using RJ-11 connectors. However, RJ-11 connections are standardized and are unlikely to vary between communication systems using RJ-11 connectors.

Other structures are possible for filters according to the claims. For example, the filters could be active filters or the filters could be Chebyshev-type filters rather than LC elliptic-type filters as described above. The filters may be designed to alternate specifications such as a corner frequency other that 8 kHz or impedances other than 600Ω. In addition, the filters may include or be attached to other types of connectors.

Nodes of a data network can take several forms. For example, both provider node 12 and telephone company 18 can serve as a provider nodes; and both home 14, 14' as well as other locations, such as a business office, can serve as subscriber nodes.

As described, filters 32, 100, and 200 relate to telecommunication standards used in North America. Other embodiments within the scope of the claims will be required to be compatible, for example, with European telecommunications systems. Embodiments within the scope of the claims also can be used in conjunction with residential LANs to filter out even higher frequency signal components than are typically utilized in an ADSL network.

The embodiments described herein, including all dimensions, design specifications, materials, structures, arrangements, and combinations of parts, are provided as examples. It will be evident that those skilled in the art may now make numerous modifications to and uses of and departures from the specific apparatus and techniques disclosed herein without departing from the inventive concepts. Consequently, the invention is to be construed as embracing each and every novel feature and novel combination of features present in or possessed by the apparatus and techniques disclosed herein and limited only by the spirit and scope of the appended claims.

What is claimed is:

1. An electronic filter adapted for receiving electrical signals transmitted by a data network and for passing low frequency components of the signals to a data receiving device, the electronic filter comprising:

an input connector adapted for electrical connection to a complimentary output connector of an asymmetrical digital subscriber line, the input connector having an input voltage node for providing electrical input signals to the electronic filter;

an output connector adapted for electrical connection to a complimentary input connector of a data receiving device, the output connector having an output voltage node for providing electrical output signals from the electronic filter; and an electrical signal processing path extending from the input voltage node to the output voltage node, electronic elements disposed along the electrical signal processing path, the electronic elements adapted to selectively pass frequency components of the electrical signals, frequency components below a predetermined comer frequency passing from the input connector to the output connector, frequency components above the predetermined comer frequency not passing from the input connector to the output connector;

said electronic filter being a modular unit electrically connectable between the complimentary output connector and the complimentary input connector;

said electronic filter having first, second, and third stages, said first, second, and third stages being connected in serial;

said first, second, and third stages each having a corresponding high voltage side and a corresponding low voltage side;

said first, second, and third stages each having an inductive transformer wherein a first winding of the transformer is connected to the high voltage side and a second winding of the transformer is connected to the low voltage side;

said first, second, and third stages each having a capacitor connected across the high voltage side and the low voltage side;

said second and third stages each having a capacitor connected across the first winding of the transformer connected to the high voltage side.

2. The electronic filter of claim 1 further comprising:

a housing, each of the input and output connectors extending through the housing.

3. The electronic filter of claim 1 wherein each of the input and output voltage nodes further comprise corresponding wire sections electrically connected to corresponding contact terminal portions, each of the contact terminal portions adapted to contact a corresponding contact terminal portion of the complimentary output and input connectors.

4. The electronic filter of claim 1 wherein each of the input and output connectors further comprises an RJ-11 connector.

5. The electronic filter of claim 1 wherein the input connector is a pair of electrical contacts.

6. The electronic filter of claim 1 wherein the electronic filter further comprises a first impedance adapted to substantially match a second impedance of a local loop of the asymmetric digital subscriber line.

7. The electronic filtering device of claim 1 wherein the input connector is integrally formed with the complimentary output connector.

8. The electronic filtering device of claim 1 further comprising a second output connector for providing unfiltered output signals, the second output connector having output an voltage node electrically connected to a corresponding input voltage node of the input connector.

9. The electronic filtering device of claim 1 further comprising an outlet adapted to be secured as a hardware fixture in the network, the plate defining an opening directly adjacent to the output connector to provide a circuit path from the electrical components to the data receiving device through the opening.

10. The electronic filtering device of claim 9 wherein the electronic components are mounted on a side of the plate.

11. The electronic filtering device of claim 9 further comprising a second output connector for providing unfiltered output signals, the second output connector having an output voltage node electrically connected to the input voltage node of the input connector.

12. The electronic filtering device of claim 11 wherein the plate defines a second opening directly adjacent to the second output connector to provide a second circuit path from the input voltage node to another data receiving device through the opening.

13. A modular electronic filtration device adapted for receiving electrical signals transmitted by a data network and for passing low frequency components of the signals to a data receiving device, the electronic filter comprising:

an electronic filter;

said electronic filter including, an input adapted for electrical connection to a terminal output of a subscriber line, the input having an input voltage node for providing electrical input signals to the electronic filter, an output for electrical connection to another input of a data receiving device, the output having an output voltage node for providing electrical output signals from the electronic filter, and an electrical signal processing path extending from the input voltage node to the output voltage node, electronic elements disposed along the electrical signal processing path, the electronic elements adapted to selectively pass frequency components of the electrical signals, frequency components below a predetermined corner frequency passing from the input connector to the output connector, frequency components above the predetermined corner frequency not passing from the input connector to the output connector; and an output connector electrically connected to the output of the filter, the output connector constructed and arranged to be in electrical communication with the terminal output of the subscriber line said electronic filter having first, second, and third stages, said first, second, and third stages being connected in serial;

said first, second, and third stages each having a corresponding high voltage side and a corresponding low voltage side;

said first, second, and third stages each having an inductive transformer wherein a first winding of the transformer is connected to the high voltage side and a second winding of the transformer is connected to the low voltage side;

said first, second, and third stages each having a capacitor connected across the high voltage side and the low voltage side;

said second and third stages each having a capacitor connected across the first winding of the transformer connected to the high voltage side.

14. The electronic filter of claim 13, wherein the terminal output connector is a jack.

15. The device of claim 13 further comprising a second output connector electrically connected to the input of the electronic filter, the second output connector adapted for electrical connection to the terminal output of the subscriber line.

16. A system for receiving electrical signals transmitted by a network and for passing low frequency components of the electronic signals to a data receiving device, the system comprising:

an asymmetric digital subscriber line including a set of connecting lines extending from a main branch of the asynchronous digital subscriber line; and an electronic filter having an input, an output, an electronic signal path extending from the input to the output, and electronic elements arranged along the signal processing path, the input electrically connected to one of the connecting lines of the set of connecting lines, the output adapted to electrically connect to the data receiving device;

said electronic elements being adapted to selectively pass frequency components of the electrical signals, frequency components below a predetermined corner frequency passing from the input to the output, frequency components above the predetermined corner frequency not passing from the input to the output;

said electronic filter having first, second, and third stages, said first, second, and third stages being connected in serial;

said first, second, and third stages each having a corresponding high voltage side and a corresponding low voltage side;

said first, second, and third stages each having an inductive transformer wherein a first winding of the transformer is connected to the high voltage side and a second winding of the transformer is connected to the low voltage side;

said first, second, and third stages each having a capacitor connected across the high voltage side and the low voltage side;

said second and third stages each having a capacitor connected across the first winding of the transformer connected to the high voltage side.

17. The system of claim 16 further comprising a data receiving device connected to the output of the electronic filter to utilize frequency components below the predetermined corner frequency passed by the electronic filter.

18. The system of claim 16 further comprising a second data receiving device connected to the terminal end of another of the connecting lines of the set of connecting lines, the second data receiving device capable of utilizing frequency components of the electronic signals above the predetermined corner frequency.

19. The system of claim 18 wherein the second data receiving device comprises an ADSL terminal unit remote in electrical communication with the asymmetric digital subscriber line.

20. A data network system comprising:

a provider node for transmitting and receiving electrical signals having a plurality of frequency channels;

a set of subscriber nodes for transmitting and receiving electrical signals having a plurality of frequency channels, each subscriber node of the set being in electrical communication with the provider node via a corresponding asymmetrical digital subscriber line; and a subscriber node of the set having a data receiving device in electrical communication with the corresponding asymmetrical digital subscriber line via an electronic filter electrically connected between the data receiving device and the asymmetric digital subscriber line;

said electronic filter being adapted to selectively pass frequency components of the electrical signals, frequency components below a predetermined corner frequency passing from the input to the output, frequency components above the predetermined corner frequency not passing from the input to the output;

said electronic filter having first, second, and third stages, said first, second, and third stages being connected in serial;

said first, second, and third stages each having a corresponding high voltage side and a corresponding low voltage side;

said first, second, and third stages each having an inductive transformer wherein a first winding of the transformer is connected to the high voltage side and a second winding of the transformer is connected to the low voltage side;

said first, second, and third stages each having a capacitor connected across the high voltage side and the low voltage side;

said second and third stages each having a capacitor connected across the first winding of the transformer connected to the high voltage side.

21. The data network system of claim 20 wherein the subscriber node further comprising a second data receiving device electrically connected to the asymmetric digital subscriber line to receive unfiltered electrical signals from the provider node.

22. The data network system of claim 21 wherein the subscriber node further comprises a third data receiving device in electrical communication with the corresponding asymmetrical digital subscriber line via a second electronic filter electrically connected between the third data receiving device and the asymmetric digital subscriber line, the second electronic filter adapted to selectively pass frequency components of the electrical signals, frequency components below a predetermined corner frequency passing from the input to the output, frequency components above the predetermined corner frequency not passing from the input to the output.

23. The system of claim 22 further comprising a fourth data receiving device in electrical communication with the corresponding asymmetric digital subscriber line via the second data receiving device, wherein the second data receiving device is constructed and arranged to pass frequencies above the predetermined corner frequency to the fourth data receiving device.

* * * * *